United States Patent [19]

Nasuta et al.

[11] Patent Number: 4,504,921
[45] Date of Patent: Mar. 12, 1985

[54] MULTI-CHANNEL TEST SYSTEM USING OPTICAL WAVEGUIDE MODULATORS

[75] Inventors: Anthony T. Nasuta; Robert A. Boenning, both of Timonium, Md.

[73] Assignee: Westinghouse Electric Corp., Pittsburgh, Pa.

[21] Appl. No.: 560,271

[22] Filed: Dec. 12, 1983

Related U.S. Application Data

[63] Continuation of Ser. No. 276,767, Jun. 24, 1981, abandoned.

[51] Int. Cl.³ .......................... G02B 5/14; G06F 11/22
[52] U.S. Cl. ....................................... 364/550; 371/15; 350/356
[58] Field of Search ............... 364/550, 525, 200, 900; 371/15, 29; 350/356, 96.14

[56] References Cited

U.S. PATENT DOCUMENTS

| | | | |
|---|---|---|---|
| 3,994,566 | 11/1976 | Lotspeich et al. | 350/356 |
| 4,166,669 | 9/1979 | Leonberger et al. | 350/356 |
| 4,271,516 | 6/1981 | Smith | 371/25 |
| 4,281,904 | 8/1981 | Sprague et al. | 350/356 |

OTHER PUBLICATIONS

Herrman et al. "Diagnostic Test Circuit for Isolated Digital Inputs", *IBM Technical Disclosure Bulletin*, vol. 21, No. 1, Jun., 1978, pp. 3-4.

*Primary Examiner*—David H. Malzahn
*Attorney, Agent, or Firm*—J. B. Hinson

[57] ABSTRACT

A test system utilizing modulators responsive to signals to be tested positioned between a source of electromagnetic radiation and a sensor with the signal to be tested coupled to the input of the modulators. Preferably the modulators are positioned in optical wave guides with the modulators being electric-field operated devices to prevent any significant loading of the signals to be tested. Disclosed embodiments utilize light as the electromagnetic energy with lithium niobate substrates having titanium diffused therein forming the optical wave guides. Modulators are provided by planar electrodes affixed to the surface of the lithium niobate substrate to change the electric field across the optical waveguide. Coupling is conveniently provided to the wave guides through fiber optic bundles.

3 Claims, 4 Drawing Figures

MULTI-CHANNEL TEST SYSTEM USING OPTICAL WAVEGUIDE MODULATORS

This application is a continuation of application Ser. No. 276,767 filed June 24, 1981 now abandoned.

BACKGROUND OF THE INVENTION

1. Field of the Invention

The invention relates generally to test systems and more specifically to multi-channel test systems with each channel including a wave guide and modulator through which light is transmitted to a receiver, with the signal whose status is to be determined coupled as an input to the modulator, to modulate the input to the receiver.

2. Description of the Prior Art

Prior art test systems have typically utilized some type of direct-couple sensing device to determine the status of signals indicative of the operational status of apparatus to be tested. In determining the applicability of this type of system to a specific application it was necessary to consider the loading of the apparatus to be tested. All trends in the electronics art, particularly digital arts, clearly indicate a decrease in size of apparatus coupled with an ever-increasing operating speeds. Present data rates for digital apparatus are in the 25 megabit/second range and it is anticipated to reach 200 megabits/second in the next three to four years. Considering these requirements there is no presently available directly coupled test systems which would meet these requirements.

SUMMARY OF THE INVENTION

The test system and method, according to the present invention, substantially solves many of the problems discussed above. Each channel of a multiple channel system utilizes an electromagnetic wave guide which couples a source of elecromagnetic energy to a receiver through a modulator. The receiver includes all the circuitry necessary to determine the status of the signal coupled to the input of the modulator. The preferred modulator is an electric field-operated device providing minimum loading to the apparatus to be tested. The preferred embodiment utilizes a plurality of substantially identical channels to provide means for testing a plurality of signals with the signals being indicative of the operational status of apparatus to be tested. The preferred electromagnetic energy source is light with all the channels coupled to a common light source through a light splitting manifold. For each channel to be used to perform a test, a signal indicative of the operational status of apparatus to be tested is coupled to the input of the modulator associated with that channel to modulate the light beam transmitted through the waveguide. A light sensitive device, such as light detecting diodes is used to detect the changes in the light transmitted through the waveguide as a result of the signal coupled to the modulator input. The output signal of the detectors, in most cases will be electrical, can be processed in any convenient manner to determine the status of the apparatus.

Light sources such as light-emitting diodes operating in the range of 60 milliamps are usable as light sources. Suitable optical transmission lines include wave guides formed in lithium niobate substrates by diffusing titanium therein. Suitable modulators can be provided by affixing electrodes to the surface of the lithium niobate substrate. Utilizing this technique the multi-channel test system can be small, fast and provide minimum loading to the apparatus to be tested.

DESCRIPTION OF THE PREFERRED EMBODIMENT

Figure 1:
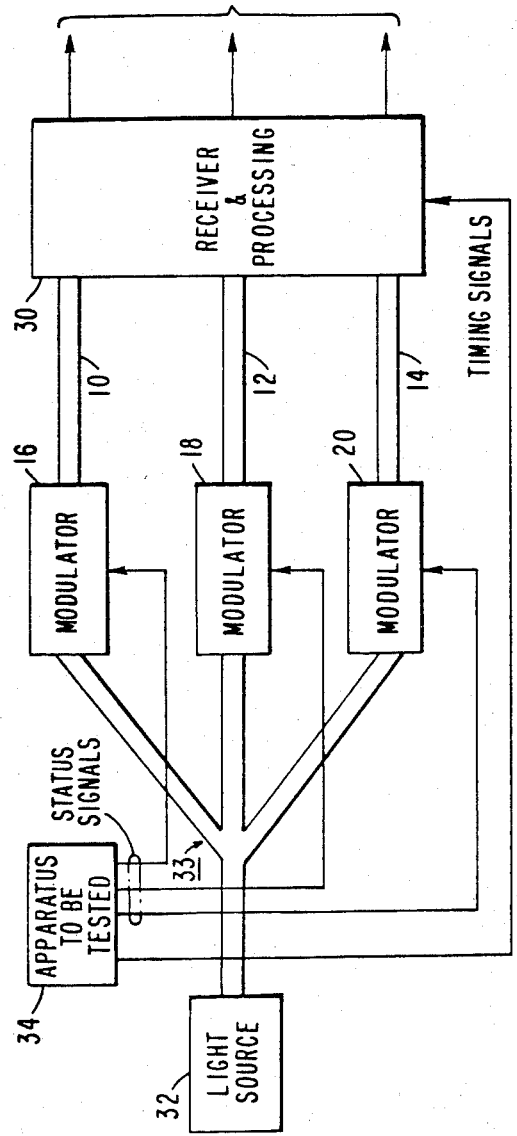
FIG. 1 is a functional block diagram of the overall system.

FIG. 1 is a functional block diagram of the preferred embodiment of the test system comprising the invention. For convenience of illustration only three channels 10, 12 and 14 of the multiple channel systems are illustrated in FIG. 1. Each of the channels 10, 12 and 14 includes a modulator 16, 18 and 20. Each of the multiple channels 10, 12 and 14 couples a receiver and processing unit 30 to a common light source 32 through a light beam splitting manifold 33. In response to status signals from the apparatus 34, (a digital computer or LSI circuit for example) whose operational status is to be determined, the modulators 16, 18 and 20 to modulate the transmitted light from the light source 32 to the processing and receiving unit 20. The processing and receiving unit 30 analyzes the light energy arriving via the various channels to determine the status of the signal coupled to the input of the associated modulator. After this analysis is complete the receiver and processing unit 20 generates signals indicative of the result of the analysis. These signals may be used to take appropriate corrective action if the apparatus 30 is operating improperly or as a monitor for the apparatus 34. If the input signals to the modulators are time dependent, the output signal of one of the modulators may be used as a strobe of a separate timing signal may be provided by the system being tested.

Timing signals to synchronize the receiver and processing unit 20 with the apparatus to be tested 34 may be required. These signals may be coupled directly from the apparatus 34 or may be derived from one or more of the test channels.

Light source 32 may be any convenient light source, such as light emitting diodes. However, the use of single mode fiber optic cables and waveguides may require a single mode light source. Suitable light beam splitting manifolds are also well known in the art. For example, it is contemplated that multiple branch optical transmission lines formed in lithium niobate substrates can be used as a light manifold. In its most useful embodiment, it is contemplated that the test system which is the subject of the disclosed invention, will be used to monitor digital systems and subsystems. Typical digital apparatus which could be monitored includes digital computers, digital memories, large scale integrated circuits, computer I/O devices and subsystems of all of these.

Figure 2:
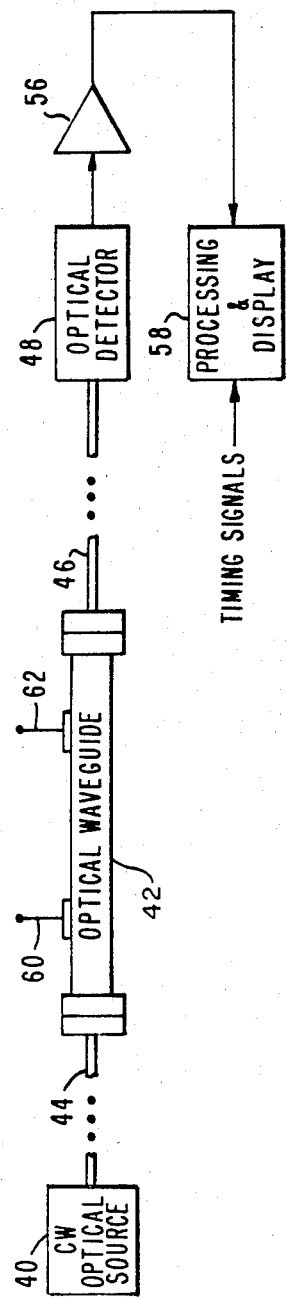
FIG. 2 is a functional block diagram of one channel of the test system.

FIG. 2 illustrates in more detail a single channel of the system illustrated functionally in FIG. 1. In this specific example a continuous wave (CW) light source 40 generates a light signal. This light signal is coupled to an optical wave guide and modulator 42 through a path 44 preferably comprising a fiber optic bundle. The output of the optical wave guide and modulator 42 is also coupled via a second path 46, preferably consisting of a fiber optic bundle, to an optical detector 48. Optical detector 48 may be a light sensitive diode or other semiconductor device for example. The output of the optical detector 48 is generally an electrical signal which is amplified by an amplifier 56 to generate at the output of this amplifier an electrical signal having convenient characteristics. This signal is then coupled to a suitable processing and display system 58.

The optical wave guide and modulator 42 may be, for example, a substrate of lithium niobate with titanium diffused in one surface to form a wave guide. Wave guides of this type are well known in the art. The transmission characteristics of the optical wave guide 42 may be modified by placing electrodes 60 and 62 on the surface of the optical wave guide to form a modulator. Other electro-optical modulators may also be utilized.

Figure 3:
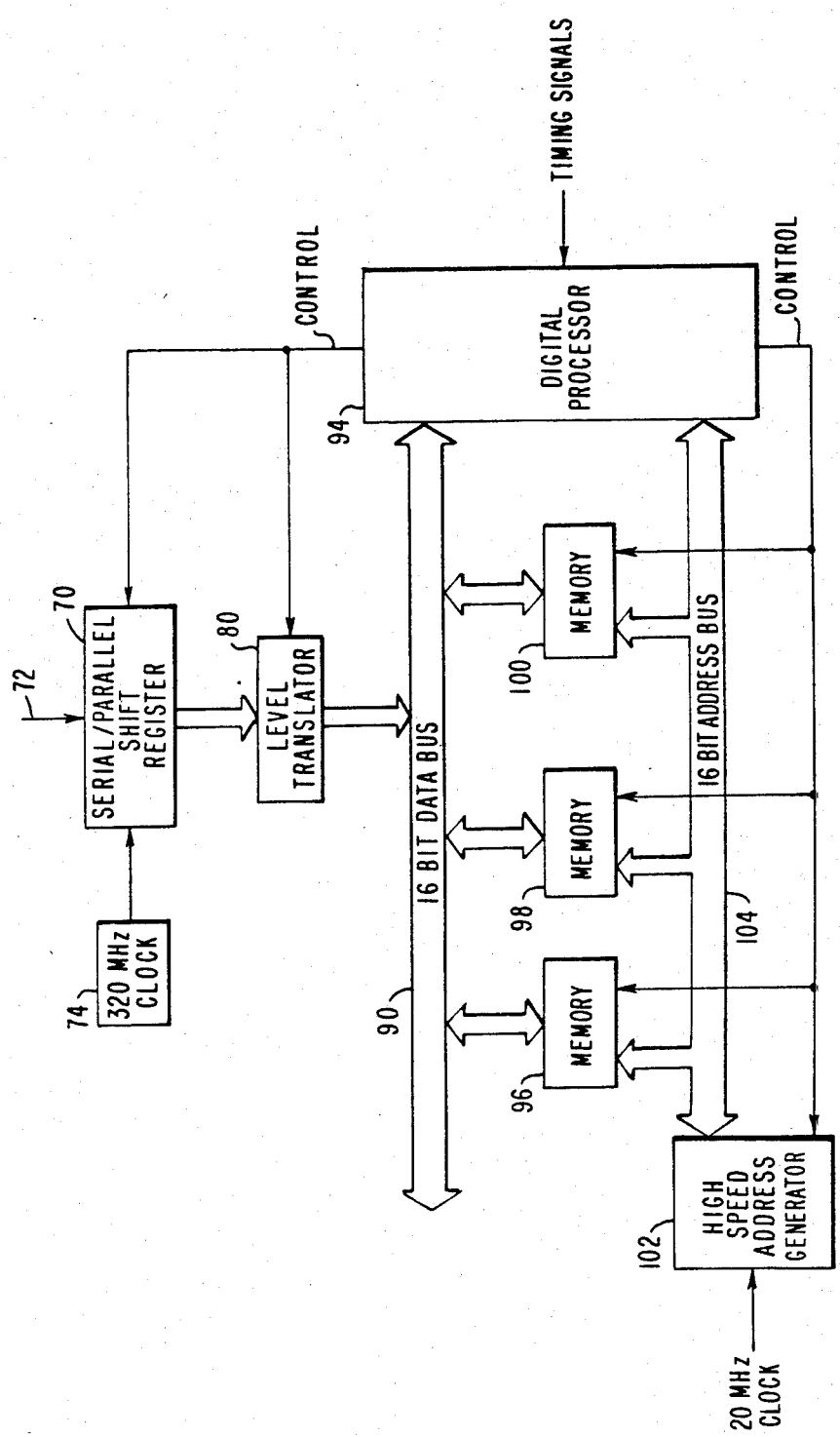
FIG. 3 is a functional block diagram illustrating how the output of the multi-channel test module can be coupled to a processor such as a general purpose digital computer.

FIG. 3 is a more detailed diagram of a system to collect and process data from a plurality of channels. In this embodiment, data processing will be done by a conventional microcomputer.

More specifically, and considering the current stage of the art, the digital output data from amplifier 56 can have a bit rate in the range of 320 MHz. This information can be conveniently coupled to the data input terminal of a serial-to-parallel shift register 70 via, for example, a single coaxial cable 72. If the system is designed such that each word of the data input signal to shift register 70 is designated as sixteen bits, data words can be transmitted from the serial-to-parallel shift register 70 at a rate of 20 million words/second. This requires that the serial-to-parallel shift register 28 be shifted by a clock generator 74 operating at a frequency of approximately 320 MHz. Frequencies in this range are most conveniently handled currently using ECL or emitter-coupled logic. This type of circuitry has a nonstandard logic level prohibiting it from being used directly by most digital data processing systems. Therefore, the output of the serial-to-parallel shift register 70 is coupled through a level translator 80 to convert the logic levels to standard levels for example those compatible with commercially available TTL logic circuits.

The output signals of the level translator circuit 80 are coupled to a 16-bit parallel data bus 90. The rate of data transfer to the data bus 90 is much higher than can be conveniently handled by most standard digital data processors and memories. Therefore, a plurality of memory modules, with three typical modules being illustrated at reference numerals 96, 98 and 100, are also coupled to the data bus. Memories 96, 98 and 100 are multiplexed to provide a sufficient data rate. Addresses to the memory modules 96, 98 and 100 are provided by a high-speed address generator 102. A separate high speed address generator is required because currently available digital processors 94, such as microcomputers, cannot supply memory addresses at the required 20 mhz rate. These addresses are coupled to the memories via an address bus 104 to which the digital processor 94 also has access. After the data has been transferred to the memory modules 96, 98 and 100 it can be read by the digital processor 94 and processed in any fashion which is convenient dependent upon the application.

Figure 4:
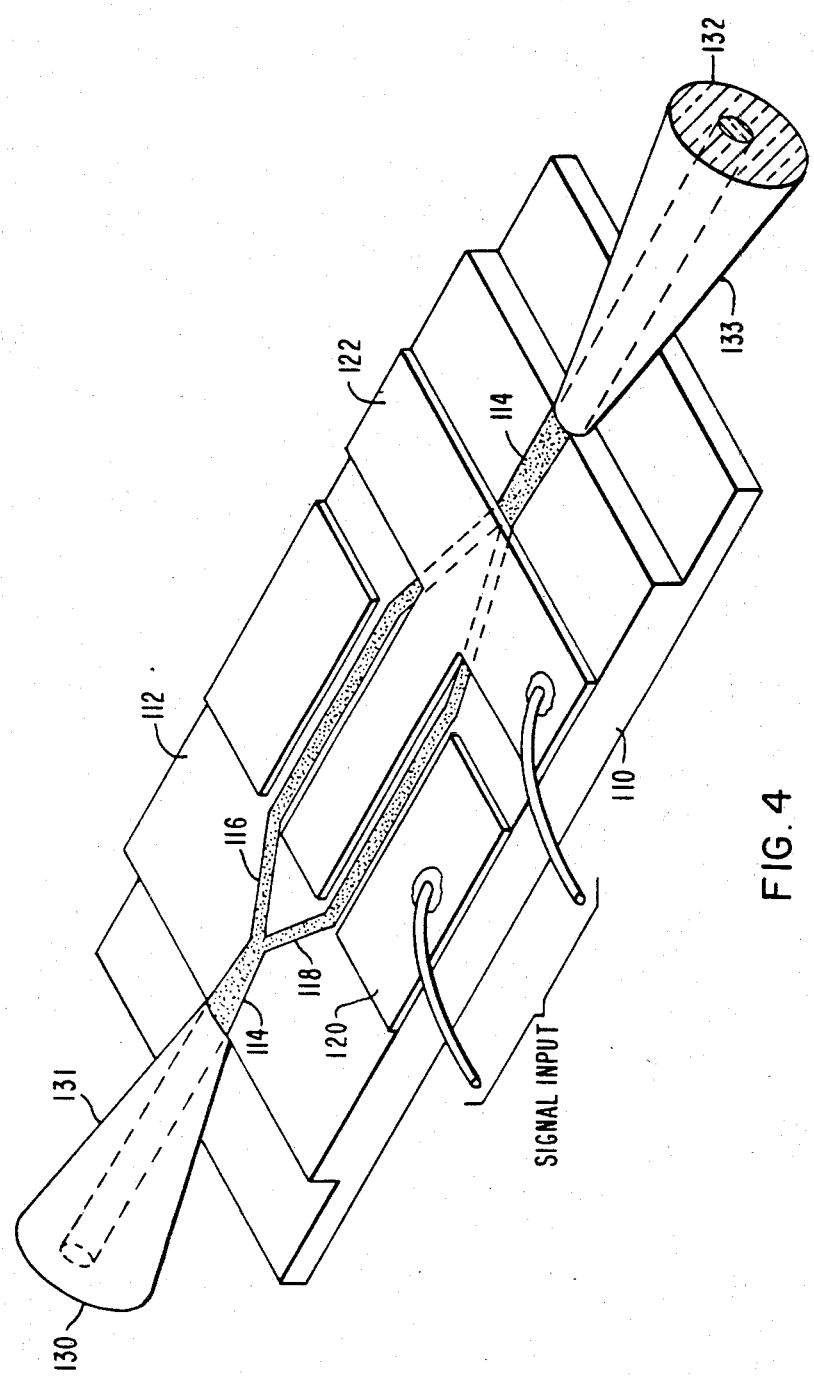
FIG. 4 is a drawing illustrating one embodiment of the optical wave guide including a modulator.

FIG. 4 illustrates in isometric view the preferred embodiment of the optical modulators illustrated at reference numerals 16, 18 and 20 of FIG. 1. Functionally, the modulator includes a substrate 110 of lithium niobate, for example. Titanium is diffused in the upper surface of the lithium niobate substrate 110 to form an optical wave guide 114. In a region between its two ends the optical wave guide 114 is divided into two branches, 116 and 118. A first electrode 120 is affixed to the upper surface 112 of the lithium niobate and extends along the outer edge of the first branch 118 of the wave guide. A second electrode 122 is also affixed to the upper surface 112 of the lithium niobate substrate 110 and extends between the two branches 116 and 118 of the optical wave guide. The signal whose status is to be determined is coupled between the electrodes 120 and 122 to impose an electrical field across the first branch 118 of the optical wave guide. This field causes the propagation velocity of the optical signal in the two branches 116 and 118 of the wave guide to vary causing amplitude modulation of signal at the output of the modulator due to combining two signals of differing phase. If sufficient phase shift is provided, the modulator can be operated as an on-off switch.

Coupling is provided to each end of the optical wave guide 114 by first and second fiber optic bundles 130 and 132. A shelf is provided at each end of the optical wave guide. Coupling is provided to the optical wave guide 114 through tapered matching sections 131 and 133. Matching sections 131 and 133 may be conveniently provided by tapering the cladding of the fiber optic bundles 130 and 132. The ends of the coupling sections 131 and 133 are positioned adjacent to the wave guide and fixed to the vertical edge of the shelf with adhesive or other suitable methods.

The modulator illustrated in FIG. 4 and discussed above when considered independently of the overall system is not a part of the subject matter of this application. This modulator was developed by co-workers of the inventor and is included in this application for purposes of showing the best current embodiment of the modulator for purposes of disclosure requirements of 35 U.S.C. 112.

The invention has been described above with reference to preferred embodiments and many modifications of the basic system can be made. For example, it will be recognized by those skilled in the art that generically the transmission lines and modulators illustrated are devices for selectively transmitting electromagnetic radiation. Therefore, a wide range of wavelengths could be used for the light source ranging from microwaves to ultraviolet and beyond provided that suitable wave guides and modulators are available. Many specific techniques may be used to detect the modulated signals. Also the data processing and display units illustrated can be modified so long as the modification results in a system which can handle the data output from the test system.

In its various embodiments, it is contemplated that the test circuits can be constructed as an integral part of the system. For example, in digital computer applications the test circuit can be a module mounted on a circuit board which may also include one or more of the circuits to be monitored. In other applications, such as LSI integrated circuits, the test module may be mounted external to the circuits to be monitored. External mounting may complicate the task of providing convenient means for coupling input signals to the modulators as well as coupling the output of the modulators to suitable detectors. This is especially true when the input signals to the modulators are digital and have a high pulse rate.

We claim:

1. A test system comprising:
   (a) an optical beam splitting manifold comprising an input branch of optical waveguide and a plurality of output branches each joining said input branch to form an optical manifold having one input and a plurality of outputs;
   (b) a plurality of optical modulators, each including at least first and second separated branches of optical waveguide being disposed in an electro-optical substrate with first ends of said first and second branches coupled to an end of one of said outputs of said optical manifold and second ends of said first and second branches joining to form an output of one of said modulators;
   (c) electrically conductive electrode means disposed on the surface of said substrate such that when an electrical potential is applied to said electrically conductive electrode means, said at least first and second separated branches of optical waveguides comprising said modulator are subjected to a differential electrical field thereby changing the relative propagation velocity of optical energy through said first and second branches of optical waveguide thereby modulating the optical beam transmitted through said optical modulator via said optical manifold;
   (d) a source of optical energy coupled to said one input of said optical beam splitting manifold; and
   (e) optical receiving means coupled to the output of said optical modulator to determine the status of electrical signals coupled to said electrically conductive electrode means by analyzing the optical output signals of said modulator.

2. A test system in accordance with claim 1 wherein said receiving means includes electrical apparatus for converting the optical output signals of said modulators to two-state (digital) electrical signals.

3. A test system in accordance with claim 2 wherein said receiving means also includes digital processing means responsive to said digital signals to determine the status of electrical signals coupled to said electrically conductive electrode means.

* * * * *